(12) United States Patent
Gu et al.

(10) Patent No.: US 9,200,711 B2
(45) Date of Patent: *Dec. 1, 2015

(54) METHOD OF TWO-STAGE FLOW CONTROL

(71) Applicant: MKS INSTRUMENTS, INC., Andover, MA (US)

(72) Inventors: Youfan Gu, Superior, CO (US); David Neumeister, Loveland, CO (US); Kevin Grout, Denver, CO (US)

(73) Assignee: MKS Instruments, Inc., Andover, MA (US)

( * ) Notice: Subject to any disclaimer, the term of this patent is extended or adjusted under 35 U.S.C. 154(b) by 71 days.

This patent is subject to a terminal disclaimer.

(21) Appl. No.: 14/162,514

(22) Filed: Jan. 23, 2014

(65) Prior Publication Data
US 2014/0130876 A1 May 15, 2014

Related U.S. Application Data

(62) Division of application No. 12/968,551, filed on Dec. 15, 2010, now Pat. No. 8,671,987.

(51) Int. Cl.
*F16K 39/02* (2006.01)
*F16K 1/52* (2006.01)
*F16K 31/122* (2006.01)
*F16K 51/02* (2006.01)
*H01L 21/67* (2006.01)

(52) U.S. Cl.
CPC ............... *F16K 1/52* (2013.01); *F16K 31/1225* (2013.01); *F16K 31/1226* (2013.01); *F16K 39/024* (2013.01); *F16K 51/02* (2013.01); *H01L 21/67017* (2013.01); *Y10T 137/0318* (2015.04); *Y10T 137/86944* (2015.04)

(58) Field of Classification Search
CPC .... F16K 1/52; F16K 41/10; Y10T 137/86944
USPC ....................... 137/630, 637.2, 883
See application file for complete search history.

(56) References Cited

U.S. PATENT DOCUMENTS

| | | |
|---|---|---|
| 3,285,287 A | 11/1966 | Curran |
| 3,741,245 A | 6/1973 | West |
| 4,041,980 A | 8/1977 | Grotloh |
| 4,148,340 A | 4/1979 | Hutton |
| 4,342,328 A | 8/1982 | Matta |
| 4,356,840 A | 11/1982 | Friedland et al. |
| 5,318,272 A | 6/1994 | Smith |
| 5,848,608 A | 12/1998 | Ishigaki |

*Primary Examiner* — John Fox
(74) *Attorney, Agent, or Firm* — James R. Young; Cochran Freund & Young LLC

(57) ABSTRACT

A valve has a major valve closure member with a valve stem for opening and closing a major port in a valve chamber. An alternate flow path extends through the major valve closing member. Flow is controlled through the alternate flow path by directing a minor valve actuating fluid through the valve stem to apply pressure on a minor valve piston in the major valve closure member to move a minor valve closure member in the major valve closure member between a closed mode in which the minor valve closure member closes the alternate flow path and an opened mode in which the minor valve closure member opens the alternate flow path. The minor valve actuating fluid is sealed from the alternate flow path by a flexible diaphragm positioned between the minor valve actuating fluid and the minor valve piston, so the pressure of the minor valve actuating fluid is applied to the minor valve piston via the flexible diaphragm.

12 Claims, 11 Drawing Sheets

METHOD OF TWO-STAGE FLOW CONTROL

TECHNICAL FIELD

The present invention is related to valves for controlling flows of fluids, for example, pneumatic actuated isolation valves that open or close quickly to start and stop gas or other fluid flows.

BACKGROUND

There are many pneumatically actuated valves for controlling gas flows in use for many applications. One example application is the use of pneumatic valves for controlling the flows of various gases into and out of vacuum chambers, including load lock vacuum chambers providing a buffer space for assisting the transfer of wafers into and out of vacuum coating or processing chambers, where such wafers, parts, or other substrates (hereinafter all called "wafers" for convenience) are coated with thin films of semiconductor and/or dielectric materials, or etched to removed a deposited material on the wafer surface. In such installations, the vacuum coating or processing chamber is generally maintained at a set vacuum range that is appropriate for the particular vacuum coating process that is being used, for example, a chemical vapor deposition (CVD) process, and a load lock chamber is connected to a slit wafer transfer valve or gate entrance of the vacuum chamber. The load lock chamber also has a slit gate opening to atmosphere. Wafers intended to be processed can be inserted from ambient atmospheric pressure into the load lock chamber, whereupon the slit gate opening to the ambient atmospheric pressure environment is closed, and the load lock chamber is then pumped down to the operating pressure range (vacuum) of the vacuum processing chamber. When the load lock chamber pressure with the wafers to be processed is evacuated to the operating pressure range of the vacuum processing chamber, the slit wafer transfer gate or valve separating the load lock chamber from the vacuum processing chamber is opened, and the wafers to be processed can then be transferred into the vacuum processing chamber for processing, e.g., for coating with a semiconductor film or other material. When the processing of the wafers in the vacuum processing chamber is completed, the finished (e.g., coated) wafers can be shuttled back into the load lock chamber. The slit wafer transfer gate or valve between the load lock chamber and the vacuum processing chamber can then be closed to isolate the vacuum processing chamber from the load lock chamber, and then air or other gas can be introduced into the load lock chamber to increase the pressure in the load lock chamber back up to ambient or atmospheric pressure so that the ambient slit can be opened and the finished, processed wafers can be removed. In some more complex processes, the load lock chamber can be connected to several vacuum processing chambers and used to shuttle wafers from one processing chamber to another, for example, at the same or at different vacuum processing pressure ranges with different process gases for different deposition coatings or layers to be applied to the wafers, or to etch the deposited materials on the wafer surface.

Persons skilled in the art know that turbulence in the load lock chamber can disturb and stir up particles in the load lock chamber and that such particles can contaminate the wafers before, during, or after processing in the processing chamber. To minimize such turbulence after the wafers are initially transferred into the load lock chamber from ambient pressure, it is a common practice to begin the process of evacuating, i.e., pumping the pressure down in, the load lock chamber slowly until the air or gas density, thus pressure, in the load lock chamber is reduced to some intermediate density or pressure before increasing the rate of pump-down or evacuation to reach the operating pressure range of the vacuum processing chamber.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting.

In the drawings.

DETAILED DESCRIPTION OF EXAMPLE IMPLEMENTATIONS

An example two-stage, slow-start valve 10 is shown diagrammatically in FIGS. 1-4. The components, functional features, and operation of the example two-stage, slow-start valve 10 will be described in more detail below, particularly in reference to the cross-section views in FIGS. 7-12, but with the understanding that these drawings and descriptions are intended to be examples, not limitations, of the invention. Instead, the scope and limits of the invention are set forth in the claims below. Generally, the example two-stage, slow-start valve 10 in the FIGS. 1-4 has conventional inlet and outlet ports 16, 18 and is pneumatically actuated, although other actuation mechanisms, for example, electric solenoids, hydraulic cylinders, or others generally known and available, can be used. Therefore, the description of the example may sometimes include terms including, but not limited to, actuation fluids with the understanding that such actuation fluids can be air or gases and possibly liquids in some applications. As best seen in FIGS. 7-12, the example two-stage, slow-start valve 10 also has two axially aligned valve closure assemblies, e.g., a major valve closure assembly 20 with a large area valve opening for high volume flow between the first and second ports 16, 18 and a minor valve closure assembly 22 with a smaller area valve opening than the major valve closure assembly 20 for a lower volume flow between the ports 16, 18. The major valve closure assembly 20 and the minor valve closure assembly 22 are separately and independently actuatable, so they can be operated individually, for example, by programmed pneumatic controls (not shown).

Figure 1:
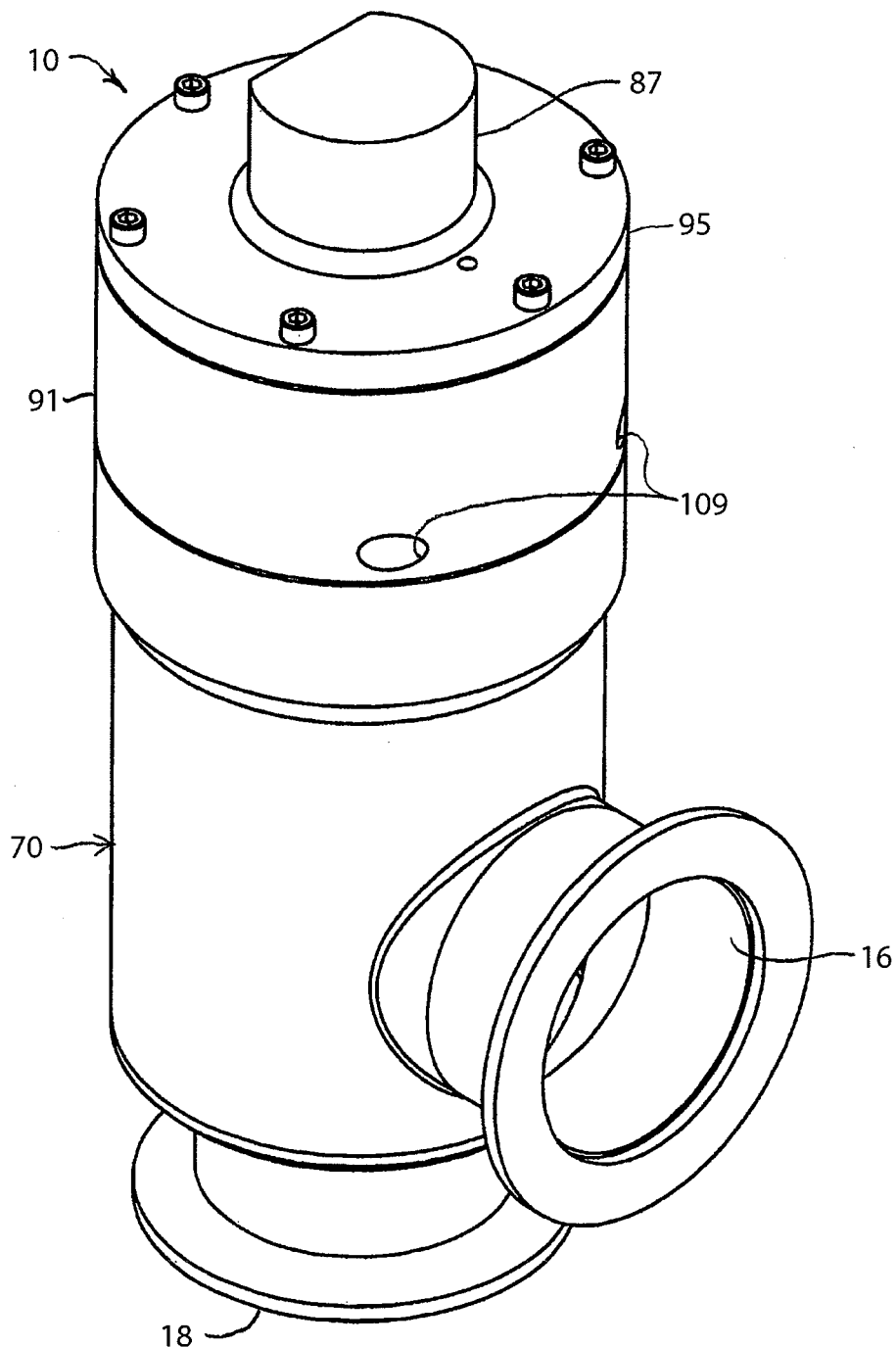
FIG. 1 is an isometric view of an example two-stage, slow-start valve.
Figure 2:
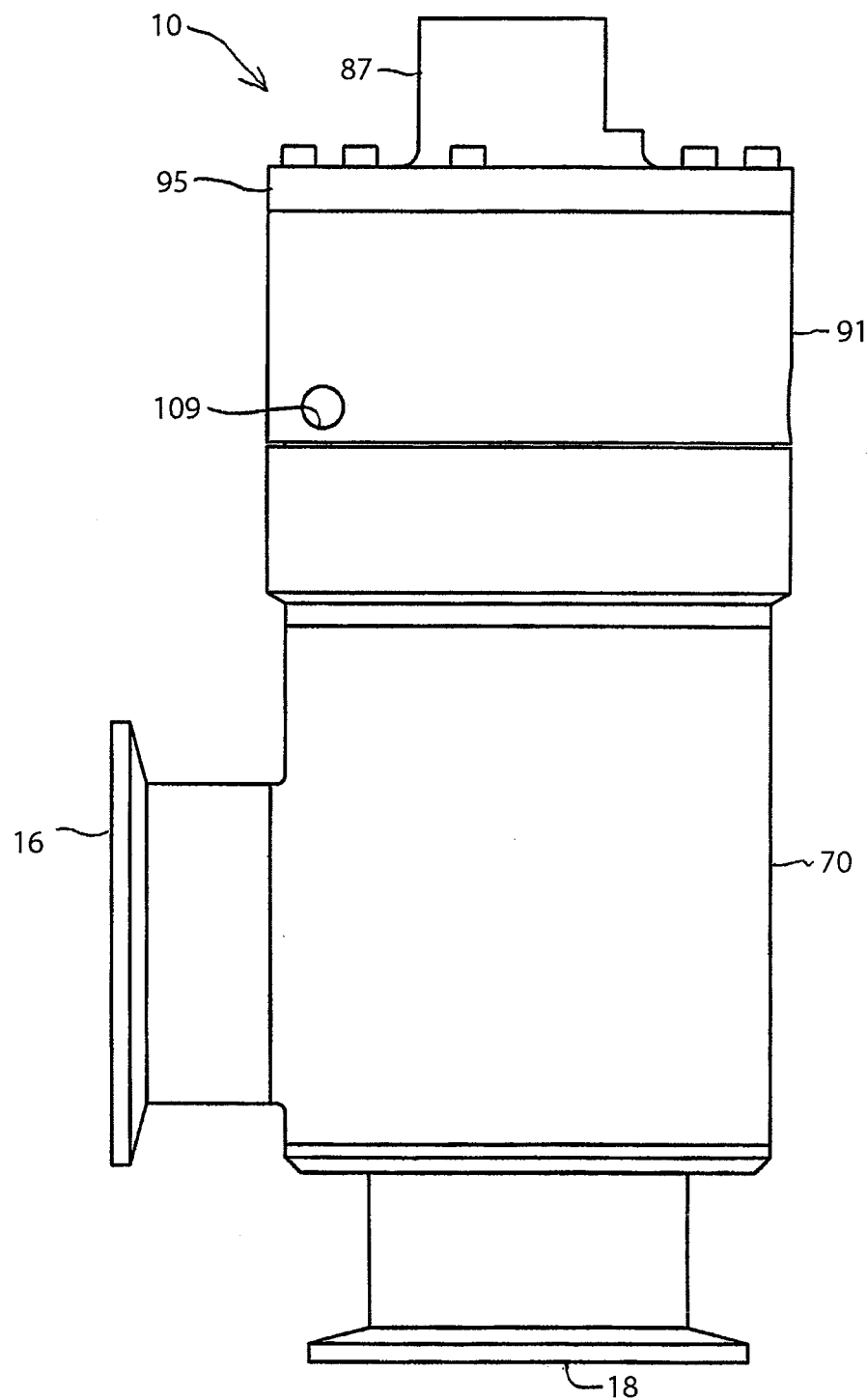
FIG. 2 is side elevation view of the example two-stage, slow-start valve in FIG. 1.
Figure 3:
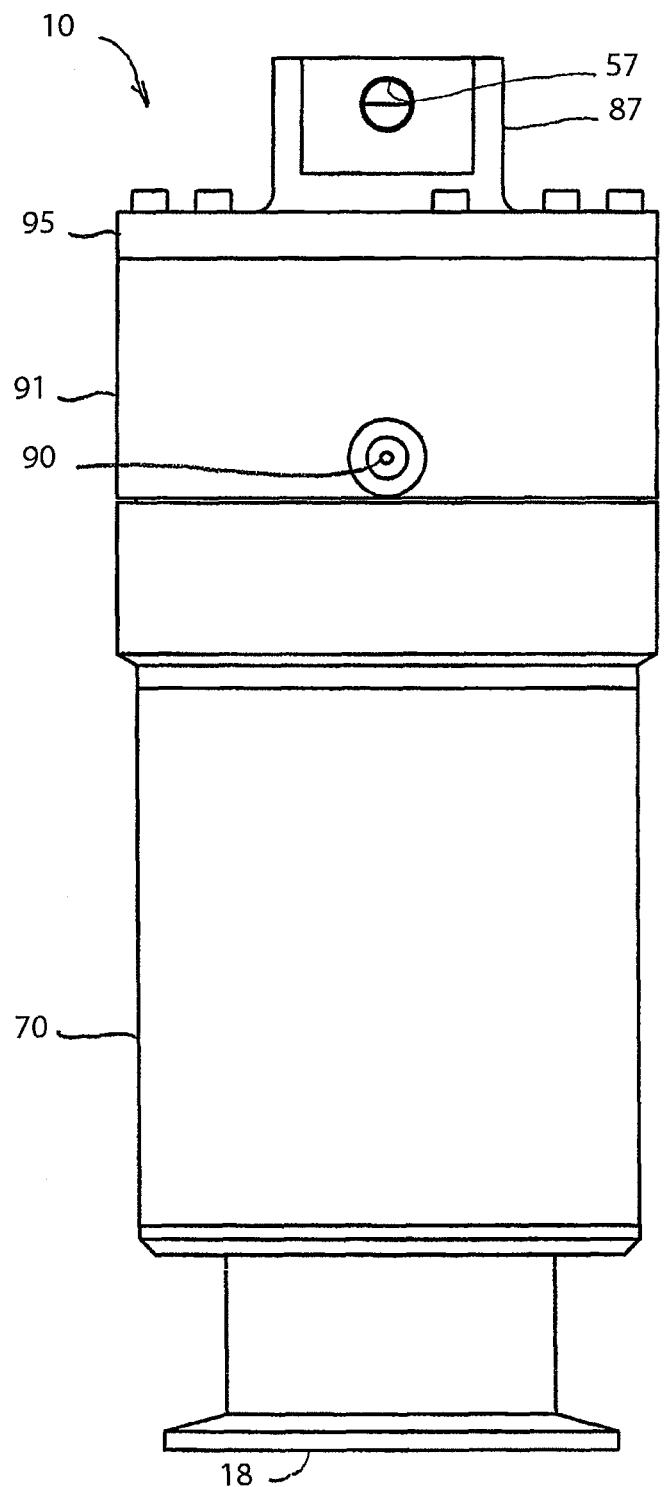
FIG. 3 is an opposite side elevation view of the example two-stage, slow start valve of FIG. 1.
Figure 4:
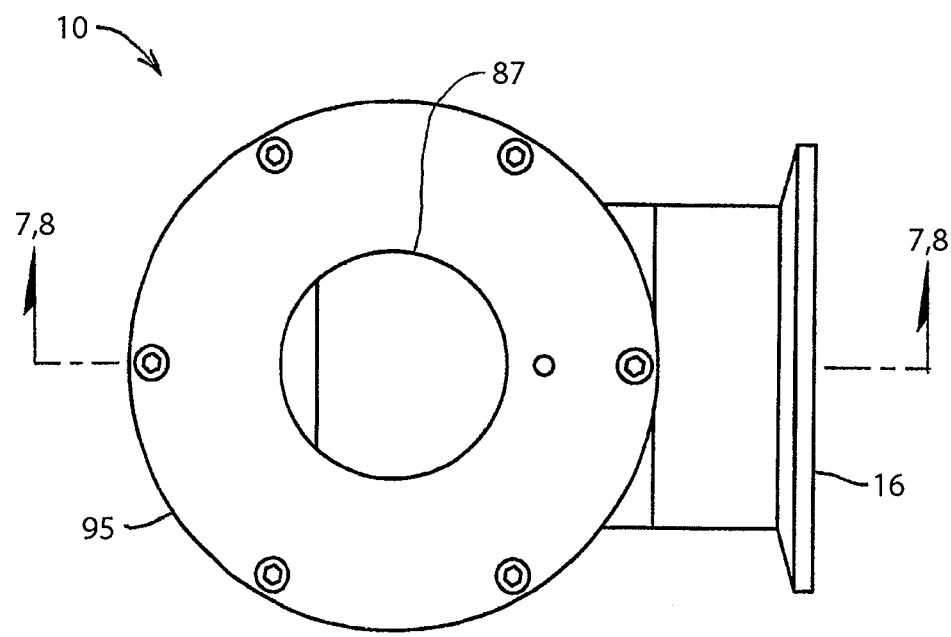
FIG. 4 is a top plan view of the example two-stage, slow-start valve in FIG. 1.
Figure 5A:
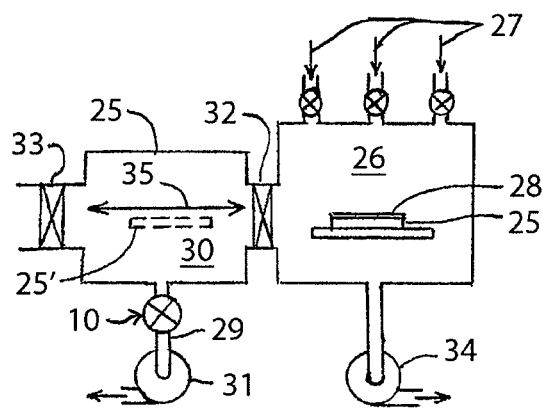
FIGS. 5*a* and 5*b* are diagrammatic views of example vacuum deposition systems to illustrate example applications for the example two-stage, slow-start valve in FIGS. 1-4.
Figure 5B:
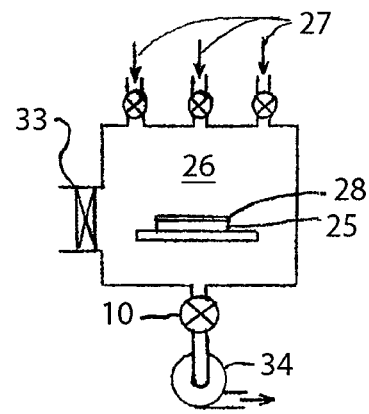

Several example applications of the two-stage, slow-start valve 10 are illustrated diagrammatically in FIGS. 5a and 5b, not as a limitation, but to assist in an understanding of the functions provided by the two-stage, slow-start valve 10. In FIG. 5a, a conventional load lock apparatus 24 is illustrated for a typical load lock function of shuttling wafers, e.g., wafer(s) 25, from an ambient environment into and out of one or more vacuum processing chamber(s) 26, as indicated by arrow 35. In a typical process, one or more feed gas precursor(s) 27 are reacted in a vacuum in the chamber(s) 26 to deposit or etch a thin film 28 of a desired material on the wafer 25. FIG. 5b depicts a vacuum processing chamber 26 without a load lock.

In the example load lock application in FIG. 5a, the two-stage, slow-start valve 10 is shown in the vacuum line 29 between the load lock chamber 30 and the load lock vacuum pump 31. In a typical vacuum processing system equipped with load lock apparatus, the processing chamber 26 is maintained by the processing chamber vacuum pump 34 at or near the vacuum pressure that is appropriate for the chemical reaction of the precursor feed gases 27 to deposit or etch the desired thin film material 28 on the substrate 25, and the load lock chamber 30 is used to shuttle the wafers 25 into and out of the processing chamber 26 as indicated by the arrow 35. Essentially, when it is desired to insert a new wafer 25 into the processing chamber 26 to be coated or etched, the interior door or gate 32 is closed to isolate the processing vacuum chamber 26 from the load lock chamber 30, the pressure in the load lock chamber 30 is brought to ambient, e.g., atmospheric, pressure, and the exterior door 33 is opened to receive the wafer 25. When the wafer 25 is placed in the load lock chamber 30, as indicated diagrammatically by the wafer 25' in broken lines, the exterior door 33 is closed to isolate the load lock chamber 30 from the ambient environment, and the load lock chamber 30 is then evacuated by the load lock vacuum pump 31 through vacuum line 29 down to a pressure at or near the vacuum pressure in processing chamber 26. When the load lock chamber 30 is evacuated to a pressure at or near the vacuum pressure in the processing chamber 26, the interior door 32 is opened, and the wafer 25 is shuttled into the processing chamber 26. The interior door 32 is then closed again, and the precursor feed gases 27 are fed into the evacuated processing chamber 26, where they react in the vacuum to deposit the desired thin film material 28 on the wafer 25 as the processing vacuum pump 34 maintains the vacuum in the processing chamber 26. With the thin film material 28 deposited (or etched) on the wafer 25 to the thickness desired, the precursor gases 27 are shut off, the interior door 32 is opened, and the wafer 25 with the thin film material 28 deposited on it is shuttled out of the processing chamber 26 back into the load lock chamber 30. The interior door is then closed again, and the pressure in the load lock chamber 30 is raised back to ambient pressure. Finally, the exterior door 33 is opened, and the wafer 25 with the thin film material 28 on it is removed from the load lock chamber 30.

A problem encountered with load lock systems is that load lock chambers 30 can and often do accumulate small particles inside the chamber, especially, on the inner wall of the chamber, and such particles can settle and land on the wafers 25 and affect the thin film 28 deposited on the wafers 25, and create defects for the wafer. This problem can be aggravated by turbulences in the load lock chamber 30 resulting from the air or gas flows in the load lock chamber 30 as it is being evacuated by the vacuum pump 31. Small particles attached on the wall surface will move into air space when turbulence occurs inside the chamber (the gas velocity, therefore the momentum, is no longer zero under the turbulence condition). To minimize turbulence, the pressure pump-down rate must be kept to a minimum to ensure that the Reynolds number of the gas or air is less than about 2200. The Reynolds number (Re) of the gas or air is related to the density ($\rho$) of the gas or air, the velocity (u) of the gas or air, the characteristic dimension (D) of the chamber, e.g., the gap between the wafer 25 and the chamber wall, and the viscosity ($\mu$) of the gas or air by the equation $$Re = \frac{\rho u D}{\mu}.$$

Figure 6:
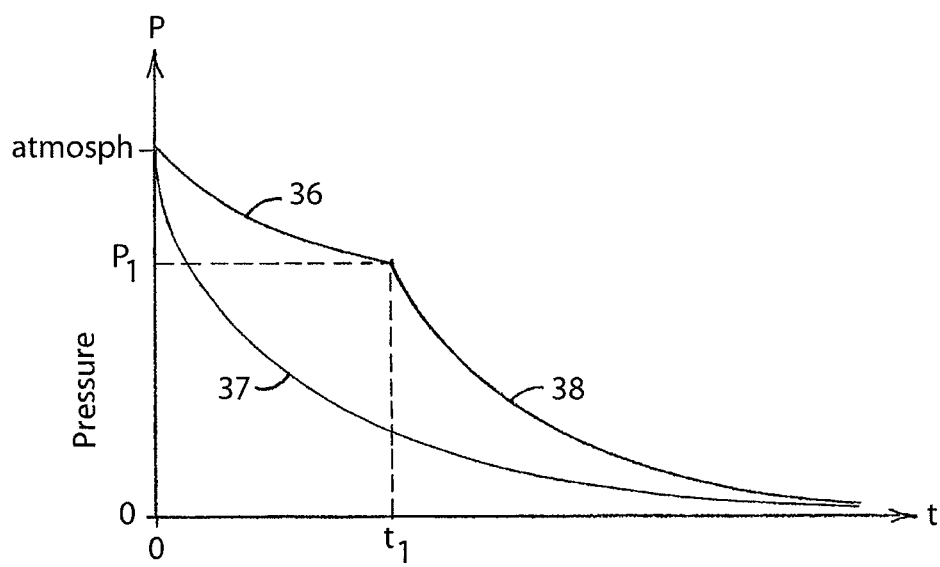
FIG. 6 is an example pressure versus time diagram comparing a slow-start pressure profile to a typical single stage pump-down or setting.
Figure 7:
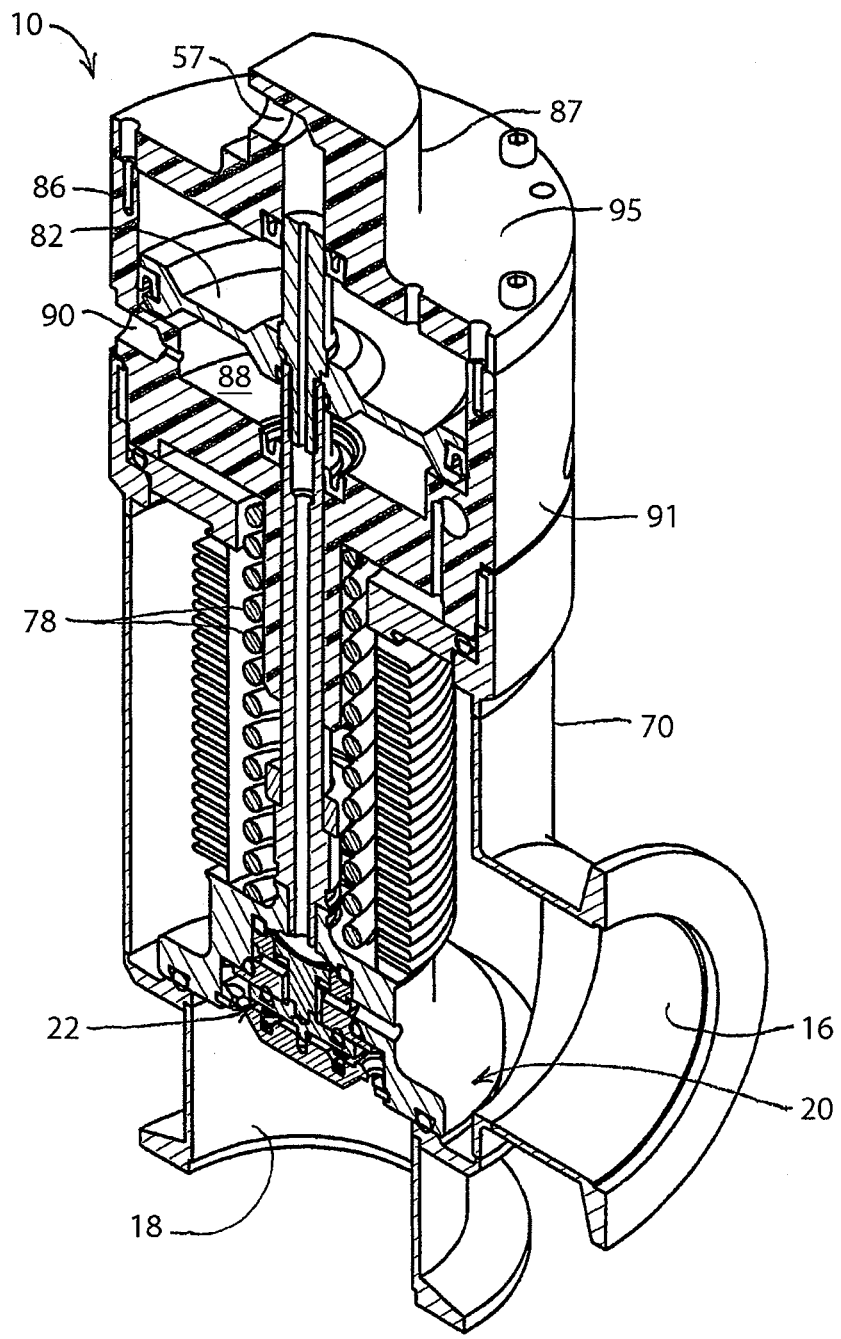
FIG. 7 is an isometric cross-section view of the example two-stage, slow-start valve taken along section line 7, 8-7, 8 in FIG. 4.

Therefore, to maintain a smaller Reynolds number (Re) for the flow in the chamber, the velocity (u) of the gas or air can be reduced by slow pump techniques. However, a slow pump-down rate is also problematic, because it can take an excessively long time to pump down the pressure in the load lock chamber 30 to the pressure level of the process chamber 26 if a constant slow pumping rate is used. Fortunately, since the gas density ($\rho$) is proportional to the system pressure, a high gas velocity (u) can be used at lower pressure (vacuum) as long as the product of $\rho$ and u is small enough to keep the Reynolds number (Re) lower than 2200. Therefore, it is a common practice to throttle the pressure pump-down rate of the load lock vacuum pump 31 in some manner during an initial period of the pump-down phase when the pressure, thus density of air or gas molecules, in the load lock chamber 30, is still fairly high and then, when the pressure (thus molecular density) of the air or gas is decreased to a sufficient extent, allowing the load lock chamber vacuum pump 31 to pump at its full capacity until the desired terminal pressure is reached. The slower pump-down rate when the pressure (thus molecular density) is still high minimizes turbulence in the load lock chamber 30, thus minimizing likelihood of stirring up particles that could settle on the wafers 25 to contaminate the wafers 25 where the thin film material 28 is deposited or etched. This two-stage pump-down technique is illustrated in FIG. 6, wherein the initial pump-down phase 36 is throttled for a time $t_1$ (as compared to a full pump capacity pump-down rate 37) until a transition pressure $P_1$ is reached where the air or gas density $\rho$ is sufficiently reduced to minimize the likelihood or severity of turbulence, e.g., to where the Reynolds number (Re) will not exceed 2200, even at full pump-down capacity of the vacuum pump 31. At or near that time $t_1$, the load lock vacuum pump 31 is allowed to pump at its full capacity 38 until the desired vacuum pressure is reached. The two-stage, slow-start valve 10 comprising this invention, which is described in more detail below, is placed in the vacuum line 29 between the load lock chamber 30 and the load lock vacuum pump 31, where it can provide the first stage 36 throttling of the pump-down mass flow rate to something less than the full pump-down capacity of the vacuum pump 31 and then open up the volumetric flow for the second stage 38.

The two-stage, slow-start valve 10 can also provide the same function in a process chamber 26 arrangement in which the process chamber 26 is operated without a load lock apparatus 25 so that the process chamber 26 itself is cycled between ambient pressure and the appropriate vacuum pressure for the deposition, etch, or other processes being used, as illustrated diagrammatically in FIG. 5b. In such an arrangement, the two-stage, slow-start valve 10 can be positioned in the vacuum line 39 between the process chamber 26 and the process vacuum pump 34.

As mentioned above and as best seen in the cross-section views of FIGS. 7-12, the example two-stage, slow-start valve 10 comprises a major valve closure apparatus 20 with a large area valve opening for high volume flow between the ports 16, 18 and a minor valve closure apparatus 22 with a smaller area valve opening than the major valve closure apparatus 20 for a lower volume flow between the ports 16, 18. In this example two-stage, slow-start valve 10, both the major valve closure assembly 20 and the minor valve closure assembly 22 are actuated pneumatically and independently of each other, although the pneumatic controls (not shown) can be operated in a manner that provides any desired sequence or combination of open and close modes for particular purposes. For example, for the slow-start vacuum pump-down of a load lock (or a process chamber) as described above, the minor valve closure assembly 22 can be opened first and kept open for the time $t_1$ in FIG. 6 until the pressure in the load lock chamber 30 (or in the CVD chamber 26) reaches a predetermined pressure $P_1$ where the air or gas density is low enough to minimize the likelihood of significant turbulence, thus film contamination problems, and then the major valve closure assembly 20 can be opened to allow the vacuum pump to pump the pressure down at the full capacity of the pump.

Referring again to FIGS. 7-12, especially FIG. 8, the example two-stage, slow-start valve 10 comprises a valve body 10 that encloses the valve trim components in a flow chamber 112 between the first port 16 and the second port 18. For convenience in this description, the first port 16 is sometimes called the inlet port 16 and the second port 18 is sometimes called the outlet port 18, as they would be in a functional installation in which the gas flows into the valve chamber 112 through the first port 16 and out of the valve chamber 112 through the second port 18, although the valve 10 could also be connected in a system in which the gas flows in the opposite direction, i.e., from the second port 18 to the first port 16. Therefore, any reference herein to the inlet port 16 or to the outlet port 18 or of gas flow from the inlet port or from the valve chamber to the second or outlet port 18 is not intended to be limiting to that particular function or installation arrangement, and any description of gas flow between those or other components can mean either direction. Also, references in this description to top, bottom, up, down, right, left, and other directional adjectives or nouns are for convenience only and related to the orientation of the drawings on the paper or screen, with the understanding that the valve 10 could be operated in any orientation or direction and that such terms are not intended to be limiting. Also for convenience, the pneumatic pressure gas for controlling and operating the major and minor valve assemblies 20, 22 is often called air, although it is understood that any gas, not just air, can be used for the pneumatic actuators and fluid could be gas or liquid.

The example valve 10 is illustrated as a "normally closed" pneumatic valve in which both the major valve closure assembly 20 and the minor valve closure assembly 22 are closed when no pneumatic actuator pressure is applied. The spring force applied by the major compression spring 78 on the major closure member 14 is to force the major closure member 14 to seat on the major annular valve seat 80 on the bottom plate of the valve body 70 around the outlet port 18, whereas enough pneumatic air pressure or other fluid pressure applied to the major piston 82 to overcome the force of the major valve spring 78 will open the major valve closure assembly 20 as will be described in more detail below. For the minor valve closure assembly 22, best seen in FIG. 9, the closing force is provided by a minor compression spring 40 applied to the minor valve closure member 42 to force the minor valve closure member 42 to seat on the minor annular valve seat 44 around a minor flow aperture 46 in a minor sleeve insert 41 inside the major valve closure member 14. The minor compression spring 40 can be a flat wave spring, since space is limited. Such flat wave springs are well-known and commercially available in many sizes and shapes.

Figure 8:
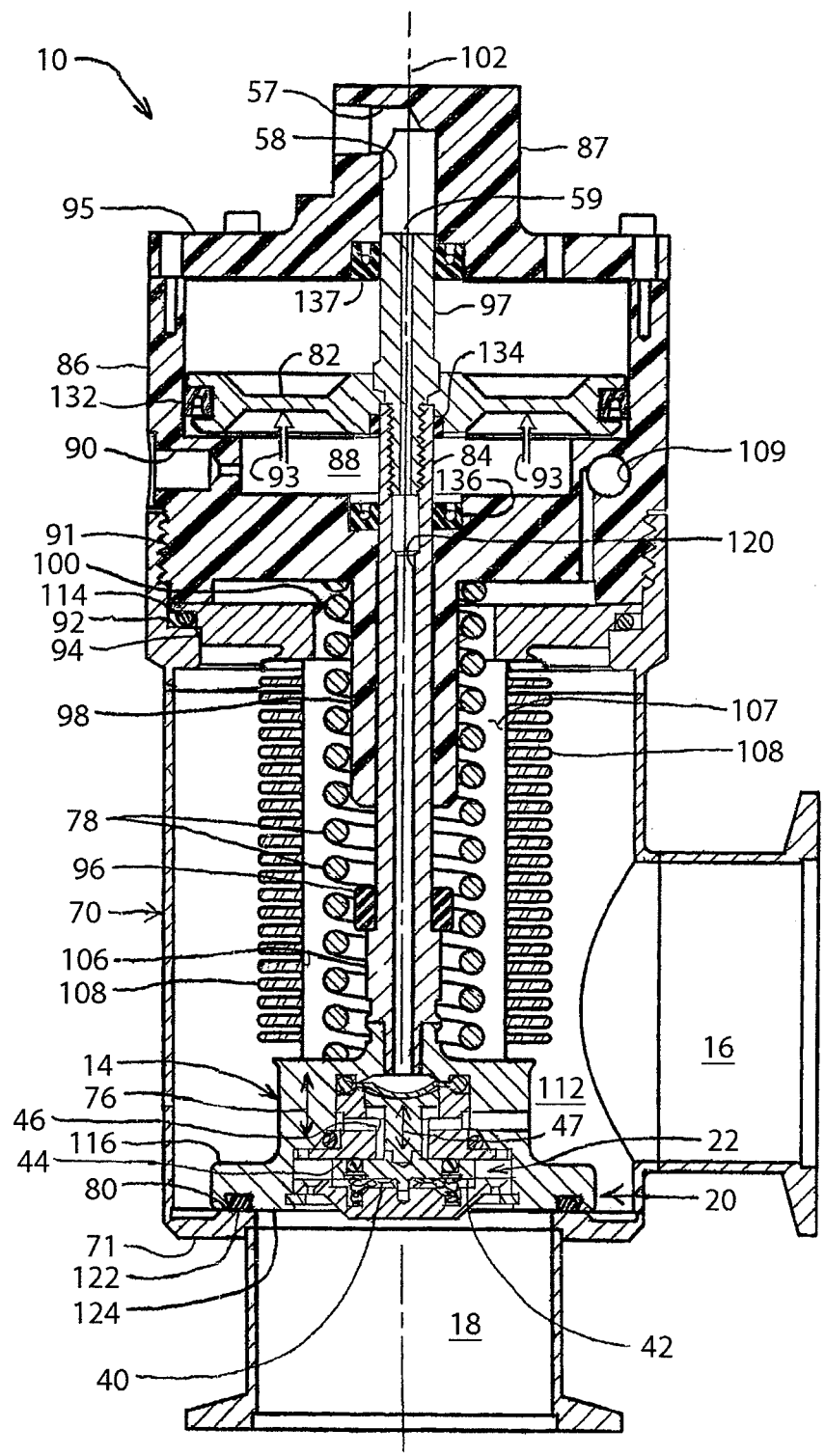
FIG. 8 is an elevation cross-sectional view of the example two-stage, slow-start valve taken along section line 7, 8-7, 8 in FIG. 4.

As will be described in more detail below, when enough pneumatic air pressure is applied to minor piston 48 (via diaphragm 50 in this example) to overcome the force of the minor compression spring 40, the minor valve closure member 42 moves away from the minor valve seat 44, thus opening the minor valve closure assembly 22, as will be described in more detail below. As mentioned above, either or both of the major valve closure assembly 20 or minor valve closure assembly 22 could be actuated by electric solenoid, hydraulic, or any other actuator mechanism instead of being pneumatically actuated. As best seen in FIG. 8, impermeable bellows member 108 separates and seals the process gas flow in the valve chamber 112 from the valve driving mechanism, including the major valve stem 84, major valve spring 72, and other valve actuating components. The bellows member 108 also isolates the process gas flow in the valve chamber 112 from the exterior of the example valve 10. For example, as can be seen in FIG. 8, the space 107 in the interior of the bellows member 108 is in fluid-flow communication with the ambient outside the valve body 70 via a duct 109 in the bonnet 91 so that air or other fluid in that interior space 107 does not compress or otherwise inhibit movement of the major closure member 14.

Figure 9:
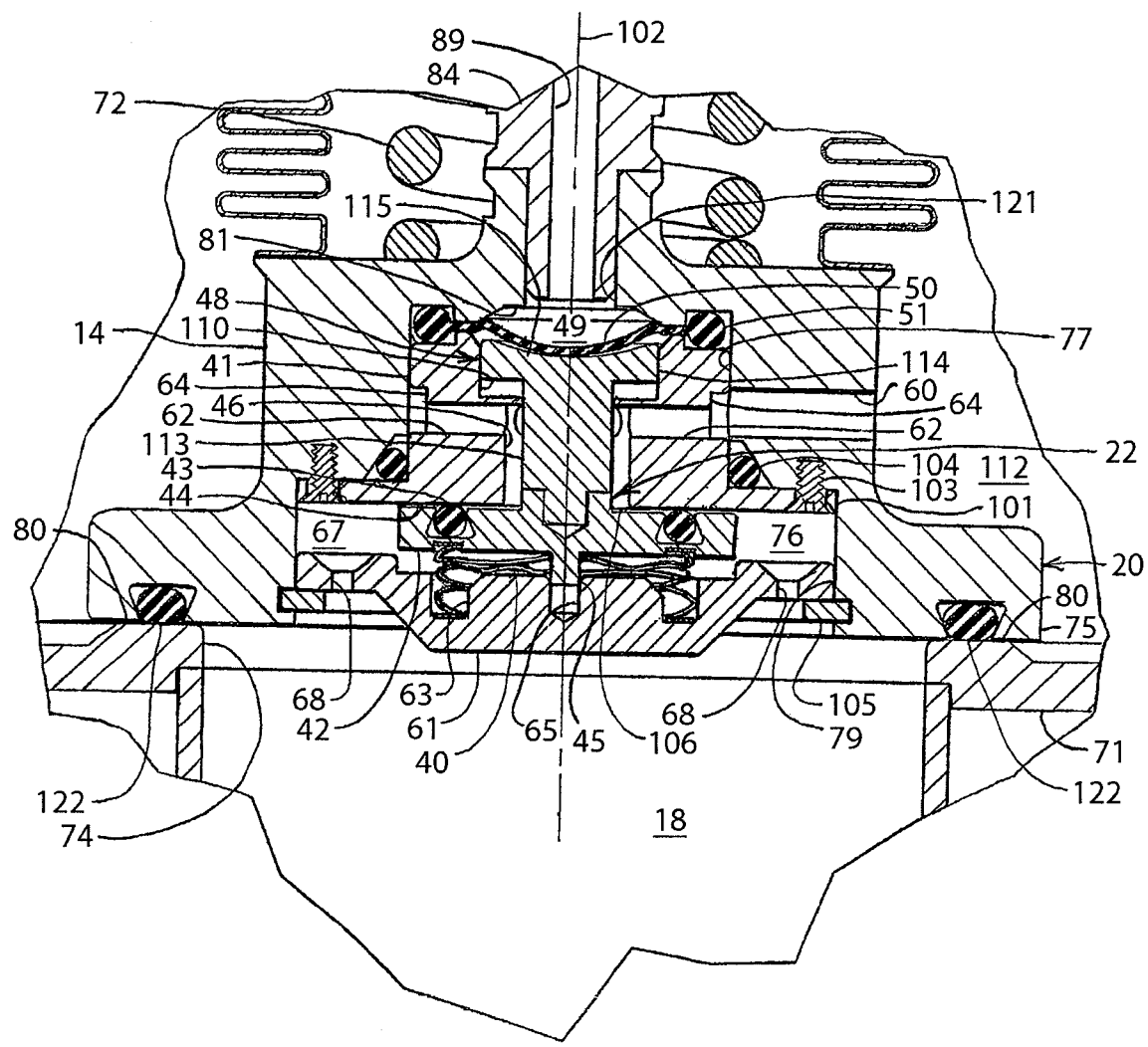
FIG. 9 is an enlarged cross-section view of the major and minor valve closure assemblies of the example two-stage, slow-start valve with both the major valve assembly and the minor valve assembly in closed mode, this cross-section view being along the same section line as FIG. 8.

In FIGS. 8 and 9, the example valve 10 is shown with both the major valve closure assembly 20 and the minor valve closure assembly 22 in closed mode, i.e., with the major valve closure member 14 and its major seal ring 122 seated and sealed on the major valve seat 80 and with the minor valve closure member 42 and its minor seal ring 43 seated and sealed on the minor valve seat 44. Therefore, in the closed mode illustrated in FIGS. 8 and 9, no gas or other fluid can flow from the valve chamber 112 to the second port 118 or vice versa. As mentioned above, the major valve spring 72 provides the closure force to seat the major valve closure member 14 and major seal ring 122 on the major valve seat 80, and the minor valve spring 40 provides the closure force to seat the minor valve closure member 42 and minor seal ring 43 on the minor valve seat 44.

As mentioned above, the minor valve closure assembly 22 in the example two-stage, slow-start valve 10 is positioned inside the major valve closure assembly 20, as best seen in FIG. 9 with secondary reference to FIG. 8. As also mentioned above, the movable components of the major valve closure assembly 20 and the minor valve closure assembly 22 are shown axially aligned on a longitudinal axis 102, and the movable components move in the longitudinal direction of the axis 102, as indicated by the arrows 47 and 76 in FIG. 8. While the center axis of the moveable components of the minor valve closure assembly 22 in the major valve assembly 20 could be laterally offset to some extent from the valve longitudinal axis 102, the illustrations in FIGS. 8 and 9 show them all axially aligned with the longitudinal axis 102 of the valve 10, which extends longitudinally through the center of the major valve seat 80 and the major valve closure member 14.

As best seen in FIG. 9, the major valve seat 80 comprises a rim on the bottom plate 71 of the valve body 70 extending around the opening 74 in the bottom plate 71 to the second port 18. A flared bottom portion 75 of the major valve closure member 14 extends radially over the major valve seat 80, and a major valve seal ring 122 in the flared portion 75 prevents fluid flow between and the major valve closure member 14 and the major valve seat 80 from the first port 16 and valve chamber 112 to the second port 18 or vice versa when the major valve closure member 14 is seated on the major valve seat 80.

A cavity 76 in the major valve closure member 14 extending axially from the bottom toward the top of the major valve closure member 14 provides part of an alternate flow path from the valve chamber 112 through the major valve closure member to the opening 74 and into the second port 18, as will be explained in more detail below, and the cavity 76 accommodates the positioning and operation of the minor valve closure assembly 22 inside the major valve closure member 14. A duct 60 extending from a lateral side of the major valve closure member 14 in the valve chamber 112 to the upper, smaller diameter portion 77 of the cavity 76 provides another portion of the alternate flow path.

As shown in FIG. 9, the minor valve closure assembly 22 comprises a minor sleeve insert 41 positioned in an upper, smaller diameter portion 77 of the cavity 76, a minor spring retainer plate 61 positioned in a lower, larger diameter portion 79 of the cavity 76, a minor valve closure member 42 positioned in the larger diameter portion 79 of the cavity 76 between the minor sleeve insert 41 and the minor spring retainer plate 61, a minor piston 48 positioned slidably in the minor sleeve insert 41 and connected to the minor valve closure member 42, a minor valve compression spring 40 positioned between the minor spring retainer plate 61 and the minor valve closure member 42, and a flexible diaphragm 50 positioned over the minor sleeve insert 41 between the minor sleeve inset 41 and the top end wall 81 of the cavity 76. The minor sleeve insert 41 is fastened in the cavity 76 by a plurality of screws 103 through a flange portion 101 of the minor sleeve insert 41. The screws 103 also tighten the minor sleeve insert 41 onto the O-ring seal 104 and the diaphragm seal 51 of the diaphragm 50 to prevent any fluid-flow circumvention of fluid in the alternate flow path between the outside of the minor sleeve insert 41 and the walls of the cavity 76. The minor spring retainer plate 61 is retained in the lower, smaller diameter portion 79 of cavity 76 by a snap ring retainer 105.

The minor sleeve insert 41 has an axial minor flow channel 46 extending longitudinally from a plurality of angularly dispersed, radially extending, lateral flow ducts 62 in the minor sleeve insert 41 to minor channel opening 106 in the bottom of the minor sleeve insert 41. A distribution channel or plenum 64 around the periphery of the minor sleeve insert 41 is aligned with the lateral duct 60 in the major valve closure member 41 and intersects the plurality of the lateral flow ducts 62 in the minor sleeve insert 41 to distribute fluid flowing from the valve chamber 112 through the lateral duct 60 to the plurality of lateral ducts 62 leading from the distribution channel 64 to the axial minor flow channel 46. The bottom of the axial minor flow channel 46 opens through the opening 106 into a space 67 between the minor sleeve insert 41 and the minor spring retainer plate 61, where the minor valve closure member 42 is positioned. The space 67 is connected in fluid-flow relation to the second port 18 outside the major valve seat 80 by a plurality of ducts 68 through the minor spring retainer plate 61. Therefore, the alternate flow path between from the valve chamber 112 through the major valve closure member 14 to the second port 18 includes the lateral duct 60 in the major valve closure member 14, the distribution channel 64, lateral ducts 62, and axial flow channel 48 in the minor sleeve insert 41, the space 67 between the minor sleeve insert 41 and the minor spring retainer plate 61, and the ducts 68 in the minor spring retainer plate 61.

A portion of the bottom surface of the minor sleeve insert 41 around the opening 106 forms a minor valve seat 44. The minor valve closure member is positioned in the space 67 in axial alignment with the opening 106 of the axial flow channel 46 in the minor sleeve insert 41 with the minor ring seal 43 (e.g., an O-ring seal) of the minor valve closure member 42 aligned axially with the minor valve seat 44. Therefore, when the minor valve closure member 42 with its minor seal ring 43 is pressed by the spring force of the minor valve spring 40 against the minor valve seat 44, it occludes the opening 106 and prevents fluid flow in the alternate fluid flow path between the axial flow channel 46 and the space 67. However, when the minor valve closure member 42 is moved axially away from the valve seat 44 and opening 106, fluid can flow in the alternate flow path all the way from the valve chamber 112 to the second port 18, even when the major valve closure member 14 with its major seal ring 122 is seated on the major valve seat 80.

The upper portion of the minor sleeve insert 41 forms a minor cylinder housing 110 enclosing a minor piston chamber 49 and serves as a sleeve for a minor piston 48 positioned slidably in the minor cylinder housing 110. The top end wall 81 of the cavity 76 in the major valve closure member 14 forms the top of the minor piston chamber 49. A smaller diameter stem portion 113 of the piston 48, which could be a piston rod, extends from the larger diameter head portion 114 of the piston 48 in the piston chamber 49, longitudinally through the axial flow channel 46 and opening 106 to a connection with the minor closure member 42. Pressurized minor valve actuating fluid is directed into the piston chamber 49 over the piston 48 via an axial duct 89 extending longitudinally through the major valve stem 84 and is connected to the major valve closure member 14. The duct 89 is in fluid-flow relation with the minor piston chamber 49 via an axial hole 121 through the top of the major valve closure member 14. The major valve stem 84 can be connected to the major valve closure member 14 by threads in the hole 121 or by any other convenient fastening method or apparatus.

Minor valve actuating fluid pressure applied from the duct 89 to the top of the minor piston 48 in the minor piston chamber 49 can push the minor valve closure member 42 against the force of the minor valve spring 40 away from the minor valve seat 44. An axial, longitudinal protuberance 45 from the bottom of the minor valve closure member 42 extends slidably into an axial hole 65 in the minor spring retainer plate 61 to keep the minor valve closure member 42 in axial alignment with the minor cylinder housing 110 to prevent binding as the minor piston 48 and minor valve closure member 42 move axially to and away from the minor valve seat 44. The minor valve spring 40 can be mounted in an annular groove 63 in the top surface of the spring retainer plate 61 to hold the minor valve spring 40 in proper axial alignment.

A flexible diaphragm 50 that is impervious to the minor valve actuating fluid is mounted in the minor piston chamber 49 over the top surface 115 of the minor piston 48 and sealed by a peripheral ring seal 51 squeezed between the minor sleeve insert 41 and the top end wall 81 of the cavity 76 in the major valve closure member 14. Therefore, the flexible diaphragm 50 seals the pressurized minor valve actuating fluid in the minor piston chamber 49 from the alternate fluid flow path through the axial minor flow channel 46, while the pressure of the minor valve actuating fluid in the minor piston channel 49 is applied to the top surface 115 of the minor piston 48 via the flexible diaphragm 50, as will be explained in more detail below. The top surface 115 of the minor piston 48 is concave to conform more closely to the natural extended shape of the diaphragm 50 when pressurized minor valve actuating fluid is applied to the diaphragm 50.

Figure 10:
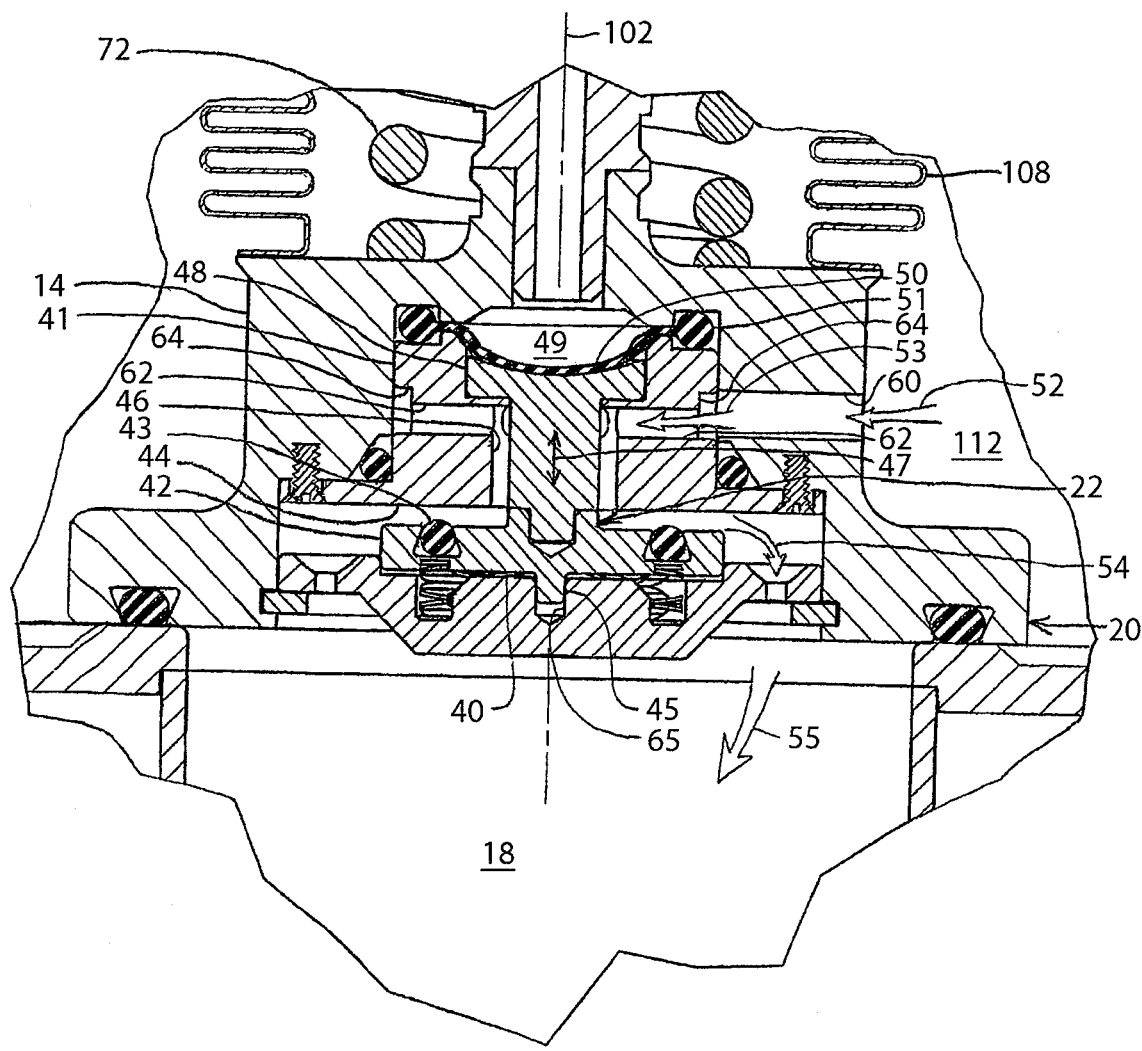
FIG. 10 is an enlarged cross-sectional view of the major and minor valve closure assemblies similar to FIG. 9, but with the minor valve assembly shown in opened mode while the major valve assembly is in closed mode.

Referring now primarily to FIG. 10 with secondary reference to FIG. 8, the minor valve closure assembly 22 is shown in FIG. 10 in the opened mode with its minor valve closure member 42 and minor seal ring 43 moved away from the minor valve seat 44 on the bottom surface of the minor sleeve 41 in the major valve closure member 14, while the major valve closure assembly 20 is still in the closed mode. With the minor valve closure assembly 22 in the opened mode, as shown in FIG. 10, gas or other fluid in the valve chamber 112 can flow through the alternate flow path described above as indicted by flow arrows 52, 53, 54, 55 through the duct 60 in the major valve closure member 14 and through one or more ducts 62 and axial flow channel 46 in the minor sleeve insert 41, from where it can escape into the second port 18 by flowing between the minor valve seat 44 and the minor valve closure member 42. In the example valve 10, an annular plenum 64 formed, for example, by an annular groove or channel around the periphery of the minor sleeve member 41 connects the duct 60 in the major valve closure member 14 in fluid-flow relation to a plurality of ducts 62 extending from the annular plenum 64 to the axial flow aperture 46. The minor valve closure member 42 is moved to the opened mode in the example valve 10 by fluid pressure, e.g., pneumatic air pressure, applied to the minor piston 48 via the diaphragm 50 as explained above, which forces the minor valve closure member 42 against the minor valve spring 40 bias to move the minor valve closure member 42 downwardly, away from the minor valve seat 42. The pressurized fluid, e.g., air, is directed onto the diaphragm 50 from a minor inlet port 57 via a channel 58 (FIG. 8) formed by the major sleeve 87, an axial duct 59 extending longitudinally through a guide shaft 97, and an axial duct 89 extending longitudinally through the major valve stem 84 into the minor piston chamber 49 (FIG. 10) in the minor sleeve 41. The use of the diaphragm 50 with the seal 51 around its peripheral edge makes it unnecessary to provide a seal, such as a O-ring seal, around the minor piston 48, thus minimizing friction and resistance to axial movement of the minor piston 48 in the minor sleeve 41, as indicated by the arrow 47.

Of course, when the fluid pressure on the diaphragm 50 and minor piston 48 is removed, the minor valve spring 40 forces the minor closure member 42 back to the closed mode as shown in FIG. 8 with the minor seal ring 43 forced against the minor valve seat 42 to prevent fluid flow from the first port 16 to the second port 18, or vice versa, via the alternate flow path described above. A fluid flow controller, e.g., a conventional solenoid pilot valve (not shown), can be used to control the flow of fluid into and out of the port 57. Such fluid flow controllers are known and not a part of this invention, thus need not be shown or described for an understanding of this invention.

Figure 11:
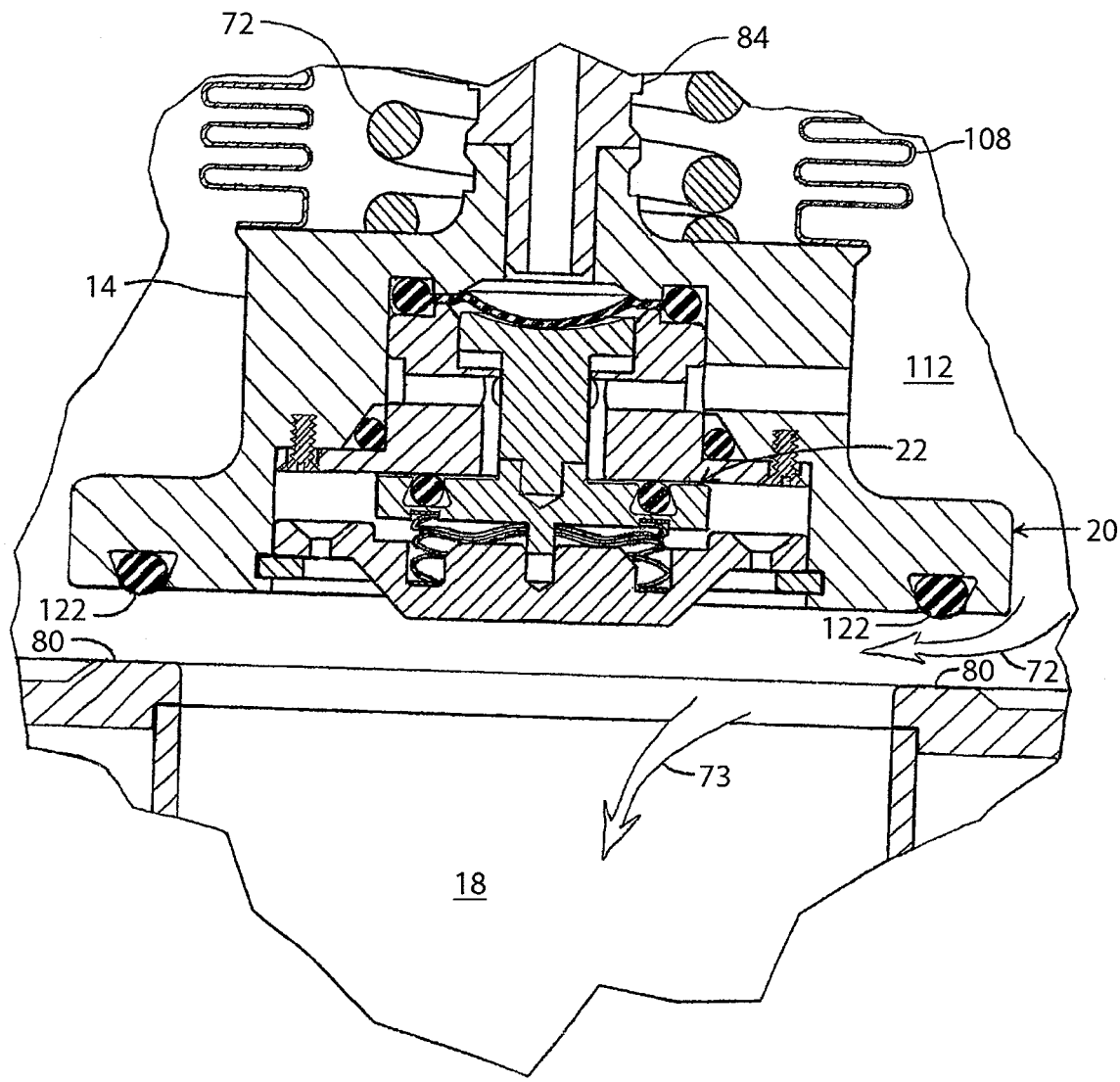
FIG. 11 is a an enlarged cross-sectional view of the major and minor valve closure assemblies similar to FIGS. 9 and 10, but with both the minor valve assembly and the major valve assembly shown in opened mode.

Operation of the major valve closure assembly 20 in the example two-stage, slow-start valve 10 can be described by reference primarily to FIGS. 8 and 11, wherein FIG. 8 shows the major valve closure assembly 20 in closed mode and FIG. 11 shows the major valve closure assembly 20 in opened mode. The minor valve closure assembly 22 is shown in FIG. 11 in the closed mode as described above, but the major valve assembly 20 and the minor valve assembly 22 can be operated independently of each other, so the minor valve closure assembly 22 could just as well be in the opened mode when the major valve closure assembly 20 is operated as described below. In the example normally closed, pneumatically actuated valve 10, a major pneumatic piston 82 (FIG. 8) is connected to the major valve stem 84, for example, by the elongated guide shaft 97 and is slidably movable upwardly and downwardly along the longitudinal axis 102 in the valve bonnet 91. The valve bonnet 91 is mounted on top of the valve body 70 and completes the enclosure of the valve chamber 112. Pressurized fluid, e.g., air or other gas, is directed into a major piston chamber 88 in a cylinder housing 86 under the piston 82 via a pneumatic air flow port 90 through a fitting (not shown) that facilitates connection of a pressurized fluid supply tube (not shown) to the flow port 90, as is understood by persons skilled in the art. The cylinder housing 86 is shown as part of the valve bonnet 91, as shown in FIG. 8, but it could be a separate component. The pressurized fluid in the major piston chamber 88 under the major piston 82 applies an upwardly directed force on the major piston 82, as indicated by the force arrows 93 in FIG. 8. With enough fluid pressure, the upwardly directed force 93 overcomes the spring force of the major coiled spring 78 and forces the major piston 82 to move upwardly to open the major valve closure assembly 20. More specifically, the major piston 82 is connected by the valve stem 84, which may also be called a piston rod, to the major valve closure member 14, so upward movement of the major piston 82 causes the major valve closure member 14 with its seal ring 122 to move axially upwardly, away from the major valve seat 80, which opens the outlet port 18 to fluid flow from the valve chamber 112, as indicated by arrows 72, 73 in FIG. 11. As long as the pressurized fluid remains in the piston chamber 88 with enough pressure, the valve closure member 14 will remain open. However, when the pressurized fluid is released from the piston chamber 88, for example, back through the port 90, the force 93 on the major piston 82 diminishes so that the spring force of the major spring 78 can force the major valve closure member 14 with its seal ring 122 to close.

The piston rod guide 98 extends axially downwardly from the cylinder housing 86 through an aperture 100 in the bellows mounting plate 94 to orient and stabilize the piston rod 84 in alignment with the longitudinal axis 102 of the valve 10. A guide shaft 97 extends from the channel 58 in the major sleeve 87 portion of the cap 95 of the cylinder housing 86, where the guide shaft 97 is slidably inserted to help maintain axial alignment, downwardly to an attachment with the major valve stem 84 in a manner that also attaches the major piston 82 to the major valve stem 84. For example, the guide shaft 97 can be threaded on its lower end for screw-type attachment to a threaded upper end of the major valve stem 84. The guide shaft 97 is sealed around its periphery against leakage of minor valve actuating fluid in the duct 58 into the major piston chamber 88 over the major piston 82 by a seal 137. A ferrule 96 can be placed on the valve stem 84 to limit travel of the major piston 82 and major valve closure member 14. The valve stem 84 is sealed along its periphery against leakage of the pressurized fluid in the major piston chamber 88 into the interior space 107 in the bellows 108 by a seal 136. The bellows 108 can be welded or otherwise attached on the top to the bellows plate 94 and on the bottom to the major valve closure member 14.

Figure 12:
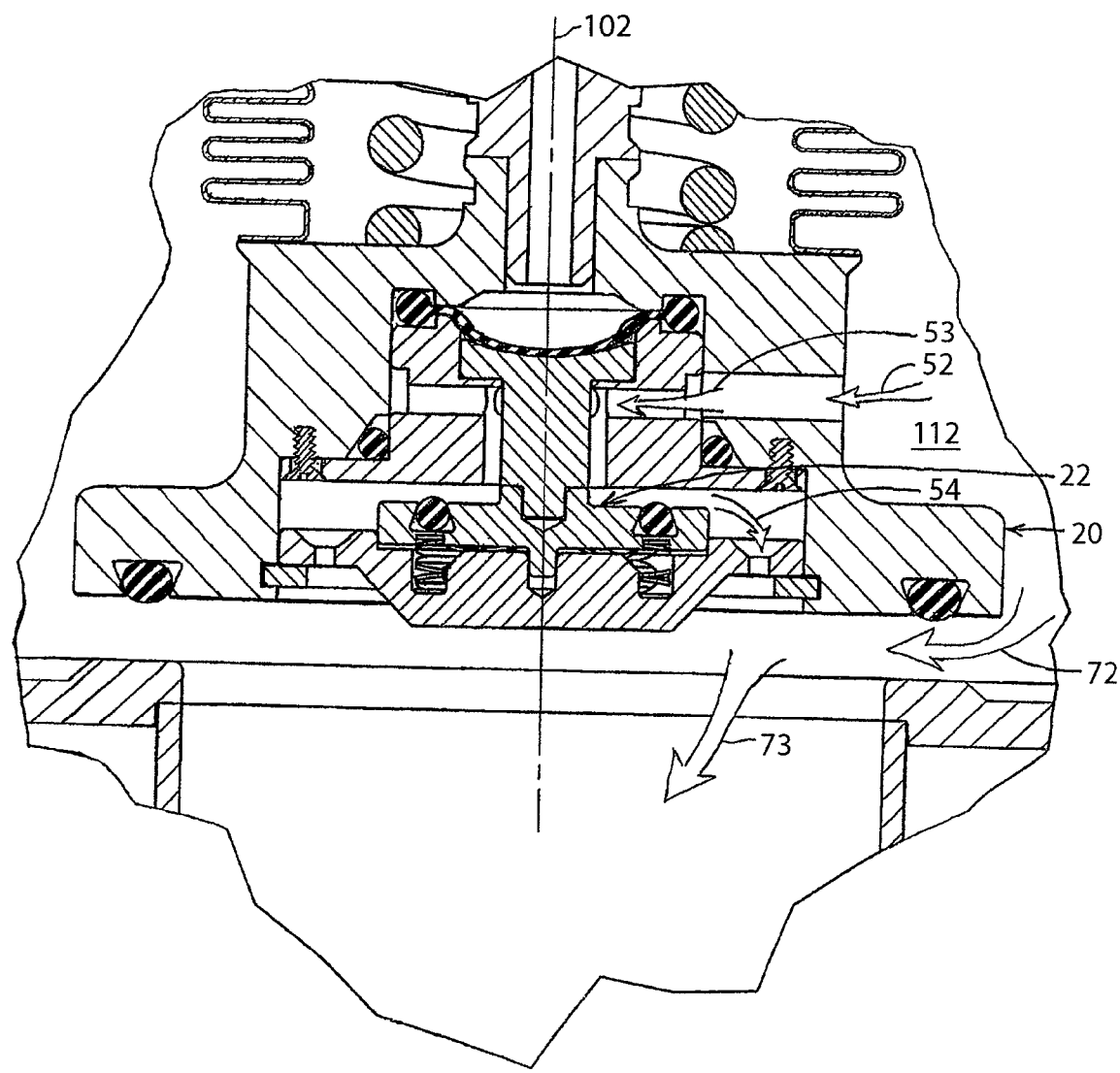
FIG. 12 is an enlarged cross-sectional view of the major and minor valve closure assemblies similar to FIGS. 9, 10, and 11, but with the minor valve assembly shown in closed mode while the major valve assembly is in opened mode.

As mentioned above, the major valve closure assembly 20 and the minor valve closure assembly 22 can be operated independently. Therefore, as shown in FIG. 12, both the major valve closure assembly 20 and the minor valve closure assembly 22 are shown for example in the opened mode to complete the illustration of the options. Again, in the context of the load lock and/or CVD chamber application described above and illustrated diagrammatically in FIGS. 5*a-b* and 6, the pump-down of pressure in the load lock chamber 30 or CVD chamber 26, can begin in a slow-start mode by opening first the minor valve closure assembly 22 with its smaller flow channels to limit the mass flow rate of the air or other gas in the load lock 30 or CVD chamber 26 until the pressure is reduced to level that decreases likelihood of turbulence that can stir up particles. Then the major valve closure assembly 20 can be opened, with or without the minor valve closure assembly 22 remaining open, to allow the vacuum pump 31 or 34 to pump the pressure down to the desired target pressure at the full capacity of the vacuum pump.

The example two-stage, slow-start valve 10 described above is also particularly useful for the load lock and/or process chamber pump-down applications described above for several additional reasons. For example, users of load locks and/or process chambers want valves that have useful life cycles in the range of five to ten million cycles, and the diaphragm 50 provides such useful life cycle capabilities, whereas conventional O-ring seals have difficulty attaining even one million cycles while maintaining effective seals in sliding applications such as sliding pistons or piston rods. Also, it is imperative that the valve not create any particulate matter that can contaminate thin films being produced in the CVD/etch chambers or transferred through load lock chambers, and the diaphragm seal 50 flexes but maintains the seal between the atmosphere and the valve chamber 112, which can be under a very low pressure (vacuum), whereas sliding friction on O-ring seals produce wear, thus particulate matter of the O-ring seal material that erodes from O-ring seals. The diaphragm seal 50 can be made of an elastomer rubber, such as, but not limit to, Viton® for general application, and per-fluoro-polymer for more harsh (corrosive and/or high temperature) condition. The diaphragm seal 50 can be fairly thick, because the travel of the minor piston 48 is very small, for example less than 0.050 inch. Consequently, the thickness can be from 0.030" to 0.125", for example, about 0.060 inch, which provides a good seal and durability for a long life, while effectively transmitting the force of the pressurized minor activating fluid to the minor piston 48. The compact configuration of the minor piston 48, minor valve closure member 42, and the other components of the minor valve closure assembly 22 with the longitudinal protuberance 45 extending slidably into a similarly sized and axially aligned hole 65 in the major valve closure member 14 along with the interior wall 66 of the minor piston chamber 49, maintains the minor piston 48 and minor valve closure member 42 in proper alignment and is less expensive to manufacture than valve closure apparatus in which long valve stems have to be properly aligned and maintained.

The foregoing description provides examples that illustrate the principles of the invention, which is defined by the features that follow. Since numerous insignificant modifications and changes will readily occur to those skilled in the art once they understand the invention, it is not desired to limit the invention to the exact example constructions and processes shown and described above. Accordingly, resort may be made to all suitable combinations, subcombinations, modifications, and equivalents that fall within the scope of the invention as defined by the features. The words "comprise," "comprises," "comprising," "include," "including," and "includes" when used in this specification, including the features, are intended to specify the presence of stated features, integers, components, or steps, but they do not preclude the presence or addition of one or more other features, integers, components, steps, or groups thereof. The terms upper, upwardly, lower, bottom, top, down, downwardly, vertical, horizontal, and other directional terms in this description are in reference to the diagrammatic orientations depicted in the drawings and are only used for convenience and clarity in this description unless otherwise indicated. They are not intended to limit the valve 10 to any particular orientation in real use applications, and, in fact, the valve 10 can be positioned and used in any desired orientation.

The invention and several embodiments in which an exclusive property or privilege is claimed are defined as follows:

1. A method of providing two-stage flow through a valve comprising:

positioning a major valve closure member in as major flow path between a valve chamber and a port that is movable between an opened mode in which fluid can flow past the major valve closure member and through the port and a closed mode in which the major valve closure member blocks flow between the valve chamber and the port;

providing an alternate flow path through the major valve closure member and positioning a minor valve closure member in the major valve closure member in a manner such that the minor valve closure member is movable between an opened mode in which fluid can flow through the alternate flow path and a closed mode in which the minor valve closure member blocks flow of fluid through the alternative flow path;

actuating the major valve closure member to move between the closed and opened modes for the major valve closure member by moving a major valve stem that is connected to the major valve closure member; and actuating the minor valve closure member to move between the closed and opened modes of the minor valve closure member by directing a minor valve actuating fluid through the major valve stem to apply a minor valve actuating fluid pressure to a minor piston that is positioned in the major valve closure member and that is operatively connected to the minor valve closure member in the major valve closure member.

2. The method of claim 1, including sealing the minor valve actuating fluid from the alternate flow path in the major valve closure member.

3. The method of claim 2, including sealing the minor valve actuating fluid from the alternate flow path by positioning a flexible diaphragm that is impervious to the minor valve actuating fluid between the minor valve actuating fluid and the minor piston in the major valve closure member.

4. The method of claim 3, including applying the minor valve actuating fluid pressure to the minor piston via the flexible diaphragm.

5. The method of claim 4, including applying the minor valve actuating fluid pressure to the minor piston via the flexible diaphragm by positioning the flexible diaphragm in contact with the minor piston so that minor valve actuating fluid pressure applied on the flexible diaphragm is transmitted by the flexible diaphragm to the minor piston to force the minor piston to move.

6. The method of claim 1, including moving the major valve closure member in one direction to the closed mode of the major valve closure member and moving the minor valve closure member in that same direction to the opened mode of the minor valve closure member.

7. The method of claim 6, including moving the major valve closure member in the one direction to the closed mode of the major valve closure member by applying a closure force on the major valve closure member with a major valve spring, and moving the minor valve closure member in that same direction to the opened mode of the minor valve closure member by applying the minor valve actuating fluid pressure to the minor piston in that same direction.

8. In a valve that has a valve chamber between and inlet and an outlet port and a major valve closure member in the valve chamber that is movable by an actuating force applied by a valve stem connected to the major valve closure member to move between a closed mode in which the major valve closure member occludes the outlet port and an open mode in which fluid can flow past the major valve closure member from the valve chamber from the inlet port to the outlet port, a method of controlling fluid flow in an alternate flow path that extends through the major valve closure member from the valve chamber to the outlet port comprising:

directing a minor valve actuating fluid through the valve stem to apply a minor valve actuating fluid pressure on a piston in the major valve closure member that moves a minor valve closure member in the major valve closure member between a closed mode in which the minor valve closure member closes the alternate flow path and an opened mode in which the minor valve closure member opens the alternate flow path.

9. The method of claim 8, including sealing the minor valve actuating fluid from the alternate flow path by positioning a flexible diaphragm that is impervious to the minor valve actuating fluid between the minor valve actuating fluid and the minor piston in the major valve closure member.

10. The method of claim 8, including applying the minor valve actuating fluid pressure on the minor piston via the flexible diaphragm by positioning the flexible diaphragm in contact with the minor piston so that minor valve actuating fluid pressure applied on the flexible diaphragm is transmitted by the flexible diaphragm to the minor piston to force the minor piston to move.

11. The method of claim 8, including moving the major valve closure member in one direction to the closed mode of the major valve closure member and moving the minor valve closure member in that same direction to the opened mode of the minor valve closure member.

12. The method of claim 8, including moving the major valve closure member in the one direction to the closed mode of the major valve closure member by applying a closure force on the major valve closure member with a major valve spring, and moving the minor valve closure member in that same direction to the opened mode of the minor valve closure member by applying the minor valve actuating fluid pressure to the minor piston in that same direction.

* * * * *